United States Patent [19]

Carasso et al.

[11] 4,402,014

[45] Aug. 30, 1983

[54] CIRCUIT ARRANGEMENT FOR DISCHARGING A CAPACITY

[75] Inventors: Marino G. Carasso; Bernardus H. J. Cornelissen; Johannes G. van Santen, all of Eindhoven, Netherlands

[73] Assignee: U.S. Philips Corporation, New York, N.Y.

[21] Appl. No.: 286,232

[22] Filed: Jul. 23, 1981

[30] Foreign Application Priority Data

Jul. 29, 1980 [NL] Netherlands ............... 8004328

[51] Int. Cl.³ .................. H04N 3/16; H04N 3/14; H03K 17/60
[52] U.S. Cl. ........................... 358/217; 307/585; 358/213; 357/24
[58] Field of Search ............... 358/213, 212, 217, 209; 357/24 R, 24 LR, 23 MG; 307/221 D, 584, 585; 365/203

[56] References Cited

U.S. PATENT DOCUMENTS 4,059,840 11/1977 van de Polder et al. ........... 350/217

OTHER PUBLICATIONS

"A New Organization Area Image Sensor with CCD Readout through Charge Priming Transfer", *IEEE Electron Device Letters*, vol. EDL-1, No. 5, May 1980, pp. 86-88, Terakawa et al.

Primary Examiner—John C. Martin
Attorney, Agent, or Firm—Paul R. Miller

[57] ABSTRACT

MOS switch is provided, in particular for a camera, with which within the line flyback time the whole optically generated signal can be transferred by periodically transferring back a fixed quantity of charge from the drain to the source.

17 Claims, 7 Drawing Figures

CIRCUIT ARRANGEMENT FOR DISCHARGING A CAPACITY

The invention relates to a semiconductor device comprising a semiconductor body having a switching device with which a quantity of charge $Q_s$ which is representative of a signal, is transferred from a first capacitor $C_s$ to a second capacitor $C_d$ within a given time interval having a finite duration T.

Such semiconductor devices cannot be used exclusively, but particularly, in pick-up camera's in which the scene to be recorded in a photosensitive layer is converted into a pattern of charge packets $Q_s$ which are transferred to a read-out member via comparatively long signal lines. Such a camera is described inter alia in U.S. Pat. No. 4,059,840. In this device the photosensitive target is accessible on one side for the scene to be recorded and on the other side comprises a number of signal strips extending in the column direction. Via switches formed by field effect transistors the signal strips are coupled to a horizontal read-out register in the form of a charge transfer register, for example a BBD or a CCD line.

The transfer of the signal charges $Q_s$ of the signal strips in the read-out register can take place in a restricted time interval T, preferably during the line flyback time. A specific value for this time interval is 10 μsec.

At the occurring currents the usual field effect transistors generally show an approximately exponential $I-V_{gs}$ characteristic in which I is the current through the transistor and $V_{gs}$ is the voltage between the gate electrode and the source zone. Consequently, when in the case in which the transistors have a threshold voltage $V_{th}=0$, $V_{gs}$ becomes smaller, the current will proceed to zero exponentially. The result of this is that the transfer of the charge packets $Q_s$ occurs more and more inert because during the transfer the voltage of the source zone varies and hence also $V_{gs}$ varies. Because the time interval which is available for the transfer of charge is finite, charge will therefore always remain on the signal strips. This charge and consequently the potential of the signal strips depends on the value of the signal. With constant exposure throughout the picture, the signal strips will adjust to a potential $U_s^o$ which is such that each signal packet $Q_s^o$, superimposed upon $U_s^o$ is fully transferred within the time interval T. With an abrupt step in the picture, for example between a low-intensity region and a high-intensity region, the signal strips will reach the new equilibrium potential only after a number of lines. In general this number depends on the value of the signals, but in particular will be larger according to whether the signals are smaller, and in specific embodiments can even reach an order of magnitude of 25. As a result of this, a great lack of definition may be introduced between lines of various intensity in the recorded scene when it is displayed, for example, on a television screen especially at lower light intensity.

The fact that the equilibrium voltage $U_s^o$ of the signal strips depends on the value of the charge $Q_s$, hence on the light intensity, may result, as has been found, in a lack of definition in a horizontal direction as a result of cross-talk between adjacent signal strips via stray capacitances.

Similar problems may occur also when photosensitive targets other than those described here are used as a result of the exponential $I-V_{gs}$ characteristic and the associated incomplete charge transfer, as is the case, for example, in picture pick-up devices in which the photosensitive cells each comprise a photo-diode and a field effect transistor for selecting and reading-out the cell. In this type of picture pick-up device, problems of lack of definition as a result of incomplete and signal-dependent signal charges as described above may also occur.

In addition, the manner in which the signal charges $Q_s$, which arise in picture sensors by generation of charge as a result of absorption of radiation, are formed is not relevant for the invention and hence the invention might also be used advantageously, besides in cameras, in different types of devices in which signal charges are to be transferred from a first capacitor to a second capacitor in a comparatively small time interval. The problems described may also occur when switches other than insulated field-effect transistors are used, so that the invention should not be restricted to field effect transistors.

It is the object of the invention to provide a semiconductor device with which a signal charge $Q_s$ can be transferred entirely within a previously determined time interval T, in which the potential of the first capacitor after transfer of $Q_s$ is in principle fully signal-independent.

The invention is based inter alia on the recognition of the fact that a rapid and complete transfer of a signal charge $Q_s$ can be achieved by conveying, for example in the case of a field-effect transistor, a fixed current $i_o$ through the transistor and superimposing hereon the signal current through the transistor, in which $i_o$ can be chosen to be so that the associated $$\left(\frac{dI}{dV_{gs}}\right)$$

which is decisive of the input impedance for small signals, still has a comfortable value.

According to the invention, a semiconductor device of the kind described in the opening paragraph is characterized in that means are present by means of which during the time interval a fixed quantity of charge $Q_t$ is periodically transferred back to $C_s$ at a frequency n/T, n and $Q_t$ being chosen to be so that in a period $t<T$, in which t is measured from the beginning of the charge transport, an equilibrium situation is reached in which the charge transferred from $C_s$ per unit of time is at least substantially equal to the charge transferred back in the same period of time in $C_s$ and the potential of $C_s$ is substantially independent of $Q_s$.

Since upon transferring a signal $Q_s$ the current through the switch does not become zero but can be adjusted at a suitable value $i_o$, an equilibrium condition can be achieved which depends only on $i_o$ and not on $Q_s$. Since furthermore the signal charge $Q_s$ itself is used for the current $i_o$, it is not necessary to provide a separate current source.

An important embodiment is characterized in that a number of elements are present in which information in the form of electronic charge can be generated and/or stored and that furthermore selection means are present by means of which the elements can be coupled selectively to the electrode of $C_s$ connected to the switching device for transferring the information stored in the elements to $C_s$.

Although in principle the invention also extends to other circuit arrangements having an (at least to an approximation) exponential I−V characteristic, for example diodes, an important preferred embodiment is characterized in that the switching device is of the field-effect type and comprises two surface regions adjoining a surface of the semi-conductor body and forming a source and drain region of the field effect device which are coupled to the first and the second capacitor, respectively, and which are separated from each other by a channel region which, viewed in the direction of the current passage from source region to drain region, comprises at least two gate electrodes which are situated one behind the other and the first of which is destined to control the current passage through the channel region and the second of which is destined to induce in the underlying part of the channel region a potential well for storing the charge $Q_t$ which can be transferred back to the source region by applying a suitable voltage to the second gate electrode. As will become apparent from the description of the figures, the transferring back mechanism can be realised in simple manners which are substantially analogous to C.T.D. technologies.

The drain region of the field effect device coupled to the capacitance $C_d$ may be situated directly behind the second gate electrode below which the charge packet to be transferred back is formed. However, a preferred embodiment which has the advantage that reaction of an empty potential well of small capacitance below the second gate electrode to the source region which may occur because the gain factor of conventional field effect transistors is not infinite but lies in the order of magnitude from 10 or 100, can be reduced considerably is characterized in that means are present by means of which the potential well below the second gate electrode, after transferring back the charge $Q_t$ to the source region, can be filled again with charge before fresh charge is transferred back from the source region to the drain region.

A semiconductor device as described here can in principle be used advantageously in all those cases where a finite quantity of charge $Q_s$ should be transferred from a first capacitor $C_s$ to a second capacitor $C_d$ in a restricted time interval T. An important application of the semiconductor device in accordance with the invention in which particular advantages are obtained is in the field of picture pick-up cameras. Another preferred embodiment is therefore characterized in that the electrode of $C_s$ comprises a strip-shaped conductor which, together with the associated information-containing elements, forms part of a picture pick-up device which comprises a number of similar strip-shaped conductors and associated information elements with the information elements being formed by a mosaic of photosensitive cells arranged in lines and columns. The parameters (frequency of the transfer back) and $Q_t$ (=value of the transferred-back charge packet) are preferably chosen to be so that the signal can be transferred within the line flyback time.

The invention moreover relates to a camera for converting an optical image into electrical signals. According to the invention such a camera is characterized by the use of a semiconductor switching element as described above.

The invention will be described in greater detail with reference to a few embodiments and the associated diagrammatic drawing, in which.

Figure 1:
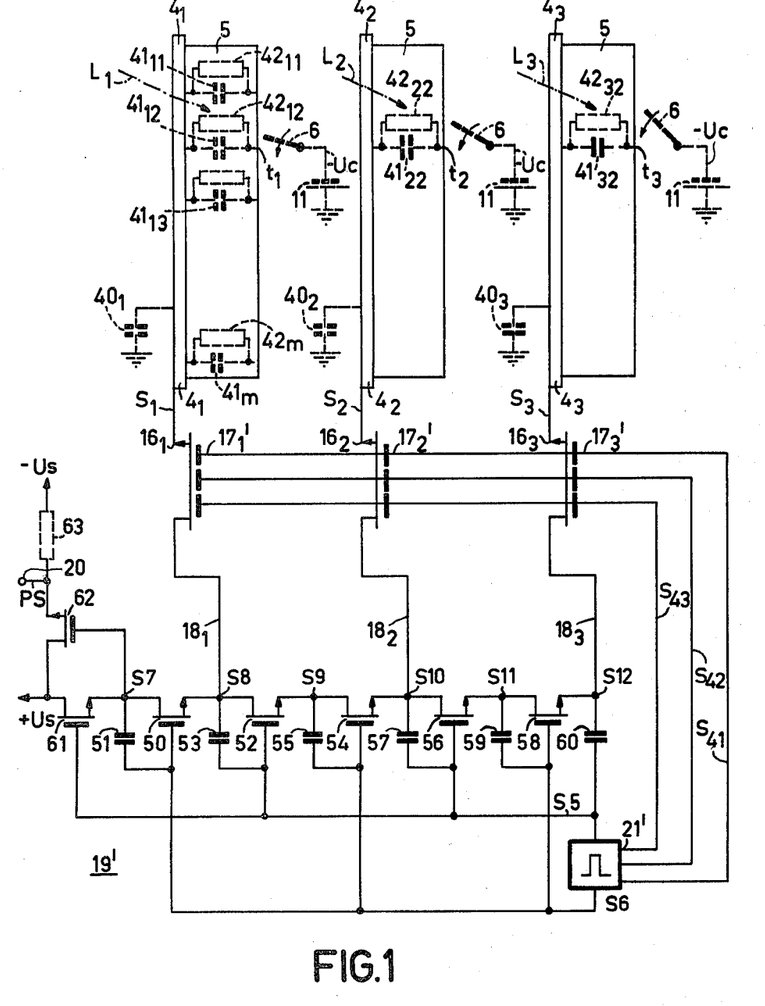
FIG. 1 shows diagrammatically a picture pick-up device with switches according to the invention.

FIG. 1 shows a diagram of a picture pick-up device which, with the exception of the switches $17'_1$, $17'_2$, $17'_3$ is described in the already mentioned U.S. Pat. No. 4,059,840.

The device comprises a two dimensional pattern of photosensitive elements $41_{11}$, $41_{12}$, $41_{13}$, $41_{22}$, $41_{32}$ etc., in a photosensitive target 5. These elements are shown diagrammatically by capacitors. The target 5 is assembled in a pick-up tube in such manner that the rear side of the target can be scanned by an electron beam 6 and that the front side is accessible to incident radiation $L_1$, $L_2$, $L_3$, etc.

The front side of the target 5 comprises signal electrode strips $4_1$, $4_2$, $4_3$ three of which are shown in the drawing but the actual number of which may in concrete cases be a few hundred. The signal strips $4_1$, $4_2$, $4_3$ which are coupled column-wise to the elements $41_{11}$, $41_{12}$, $41_{22}$, etc., are connected, via the switches $17'_1$, $17'_2$, $17'_3$, to the shift register $19'$ which in the embodiment shown consists of a bucket brigade or BBD but might also comprise, for example, a CCD. The output stage of the bucket brigade register is formed by a source follower circuit having a field effect transistor 62 and an output terminal 20.

The transistors 50, 52, 54, 56, 58 and 61 of the register $19'$, as well as the transistor 62, are assumed, by way of example, to be of the n-channel type.

Every other gate electrode of the transistors of the bucket brigade register is connected to the clock lines $S_5$ and $S_6$ and to the clock voltage source $21'$ via the clock lines. The register $19'$ moreover comprises a number of parallel inputs $18_1$, $18_2$, $18_3$, etc. which, via the switching devices $17'_1$, $17'_2$, $17'_3$, etc., can be connected to the signal electrode strips $4_1$, $4_2$, $4_3$, etc.

The picture information generated in the photosensitive target can be shifted via the strips 4 and the switch $17'$ into the capacitors 53, 57, 60 of the bucket brigade register.

The device as described here differs substantially only by the switches $17'$ from the device described in the above-mentioned U.S. Patent in which the switching devices are formed by conventional insulated gate field effect transistors.

For a more detailed description of the construction and the operation of the camera reference may therefore be made to the already mentioned U.S. Pat. No. 4,059,840. In this specification substantially only those elements will be mentioned which are necessary for a clear description of the invention.

Figure 2:
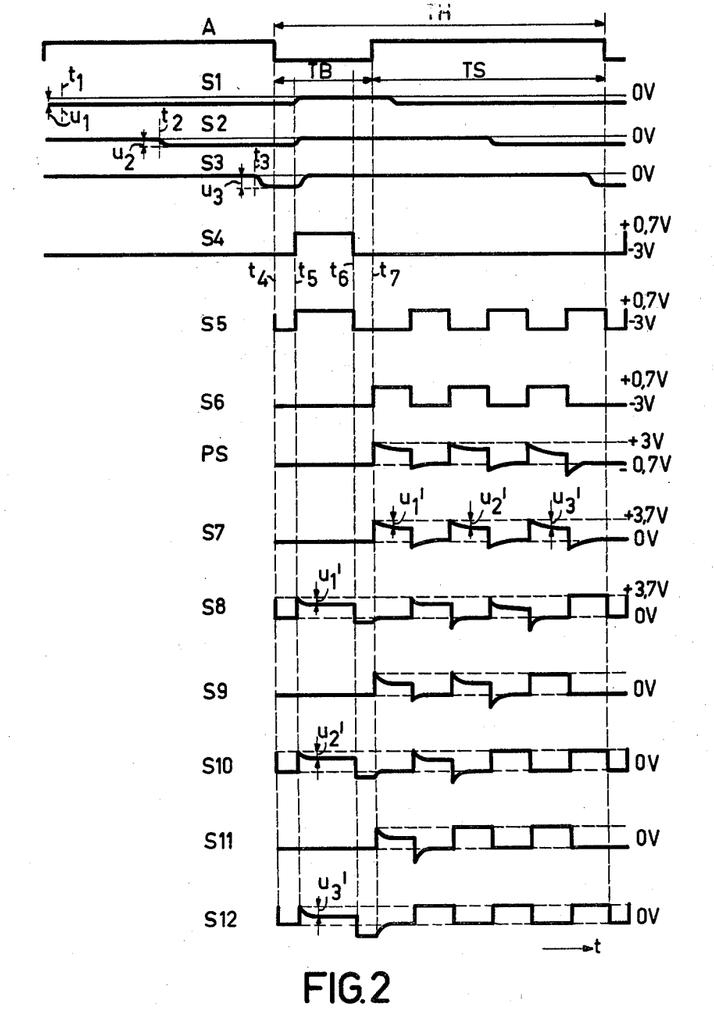
FIG. 2 illustrates voltage signals occurring during operation in a device shown in FIG. 1.

FIG. 2 shows the amplitudes of the signals $S_1$ to $S_{12}$ and the picture signal PS as they occur in the known device as a function of the time t.

The rear side of the target 5 is charged to the voltage $U_c$ (for example −5 V) by means of the electron beam 6. Reference A in FIG. 2 denotes the control signal which controls the scanning of the target 5 by means of the electron beam. TH is a line period and comprises a line flyback time $T_B$ and a line scanning time TS. The signal electrode strips $4_1$, $4_2$, $4_3$, etc., are assumed to be at reference potential, for example 0 V, at the beginning of a line scanning time.

During the integration period, light can be incident on the photosensitive target so that the capacitors $41_{11}$, $41_{12}$, $41_{22}$ etc. can be discharged, in FIG. 1 denoted diagrammatically by the leakage resistors $42_{11}$, $42_{12}$ etc. the value of which depends on the intensity $L_1$, $L_2$, $L_3$, etc. Upon scanning by an electron beam 6 at the instants $t_1$, $t_2$, $t_3$, the potential drops $U_1$, $U_2$ and $U_3$ relative to the reference potential occur at the signal electrode strips $4_1$, $4_2$, $4_3$, respectively, which drops correspond to signal drops $Q_1$, $Q_2$, $Q_3$ in the stray capacitances $40_1$, $40_2$, $40_3$. At an instant $t_4$ the line flyback time or line suppression time $T_B$ begins which ends at an instant $t_7$. In the time $T_B$ a pulse occurs in the signal $S_5$ between the instants $t_5$ and $t_6$, while simultaneously the switches 17' are closed (shown diagrammatically by the pulse in the signal $S_4$), so as to be able to transfer the signals at the capacitors $40_1$, $40_2$, $40_3$ to the bucket brigade register 19'.

For the shift register 19' it holds that between the instants $t_4$ and $t_5$ the capacitances 51, 53, 55, 57, 59 and 60 are each charged up to 3 V, which follows from the presence of the voltage $-3$ V in the signals $S_5$ and $S_6$ and of the ground potential 0 V in the signals $S_7$ to $S_{12}$. The pulse in the signal $S_4$ which is applied to the gate electrode of the transistors 17' and the pulse in the signal $S_5$ between the instants $t_5$ and $t_6$ has a voltage of $+0$ V. The voltage of 0.7 V at the gate electrodes of the transistors 17', $17'_1$ gives that at a sufficiently high voltage at the drain of the transistors the voltage at the source, that is to say at the signal electrode strip $4_1$, $4_2$, $4_3$ connected thereto, or in other words the voltage at the capacitors $40_1$, $40_2$, $40_3$, can rise to the ground potential 0 V and not higher. The voltage of 0.7 V actually is the threshold voltage which must be present between the gate electrodes and the source of the transistors 17' so as to make and keep the transistors conductive. The pulse edge occurring at the instant $t_5$ with the voltage step of $-3$ V to $+0.7$ V in the signal $S_5$ gives, via the capacitances 53, 57 and 60, an equal voltage step of 3.7 V at the drains of the transistors $17'_1$, $17'_2$. Together with the voltage of 0.7 Volt at the gate electrodes, the voltage in the signals $S_8$, $S_{10}$ and $S_{12}$ gives that the capacitances $40_1$, $40_2$, $40_3$ of the respective signal strips $4_1$, $4_2$, $4_3$ can be charged to ground potential 0 V (signals $S_1$, $S_2$ and $S_3$ in FIG. 2 at $t_5$), from the capacitances 53, 57 and 60 (signals $S_8$, $S_{10}$ and $S_{12}$). The charge conditions corresponding to the voltage drops $U_1$, $U_2$, $U_3$ at the capacitances $40_1$, $40_2$, $40_3$ can be replenished from the capacitances 53, 57 and 60 and give there voltage drops $U'_1$, $U'_2$ and $U'_3$ which correspond to $U_1$, $U_2$ and $U_3$, respectively.

The voltage step in the signals $S_4$ and $S_5$ at the instant $t_6$ gives that the switches $17'_1$, $17'_2$, $17'_3$ are cut off and an equally large voltage step occurs in the signals $S_8$, $S_{10}$ and $S_{12}$.

At the instant $t_7$ the line scanning time TS begins with on the one hand again a line scanning of the layer 5 by the electron beam 6 and on the other hand the transfer of the signals $U'_1$, $U'_2$, $U'_3$ between the capacitances 51, 53, 55, 57, 59 and 60 under the influence of the pulses given in the signals $S_6$ and $S_5$. The signals $U'_1$, $U'_2$, $U'_3$ are transported through the register 19' in a manner known per se and can be derived from the output PS.

Figure 3:
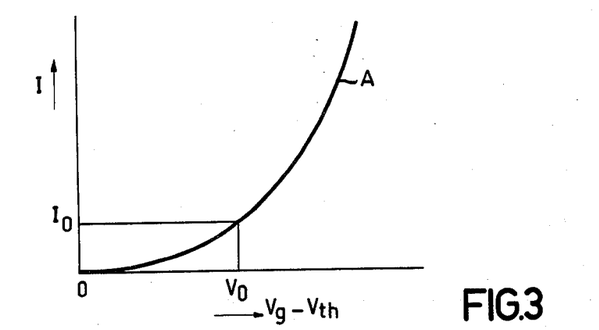
FIG. 3 shows diagrammatically a MOS-characteristic.

In the known device described the signal electrode strips $4_1$, $4_2$, $4_3$ are brought at reference voltage upon transferring the signal charges from the capacitors $40_1$, $40_2$, $40_3$ to the shift register 19', the reference voltage being given by the threshold voltage of the transistors $17'_1$, $17'_2$, $17'_3$. Such MOS-transistors (in the sub μA range) show a current voltage characteristic which has a more or less exponential variation as is shown in FIG. 3 by the curve A. In this Figure the current is plotted on the vertical axis against the gate voltage reduced by the threshold voltage (for an n-channel MOST) on the horizontal axis, Vg denoting the voltage of the gate relative to the source region. During the transfer of charge the potential of the source of the transistors varies in such manner that $V_g - V_{th}$ approaches zero. This means that the current also approaches zero, and that, when the transistors are cut off again, not all charge has been transferred. The reference potential of the signal electrode strips then is no longer equal to the threshold voltage of the transistor but depends on the signal to a greater or smaller extent. As a result of the stray capacitances between the signal electrode strips $4_1$, $4_2$, $4_3$ variations in reference voltage at a strip may moreover influence adjacent strips. In order to avoid these and other possible disadvantages at least for the greater part, switches 17' are used in the device according to the invention instead of field-effect transistors, of which FIG. 4 is a cross-sectional view and which in the circuit diagram shown in FIG. 1 are each represented by a field effect device having three gate electrodes.

It is to be noted that the switch according to the invention is suitable in particular but not exclusively for use in a camera, but that it may also be used advantageously in other systems and in which a rapid charge transport is required.

Figure 4:
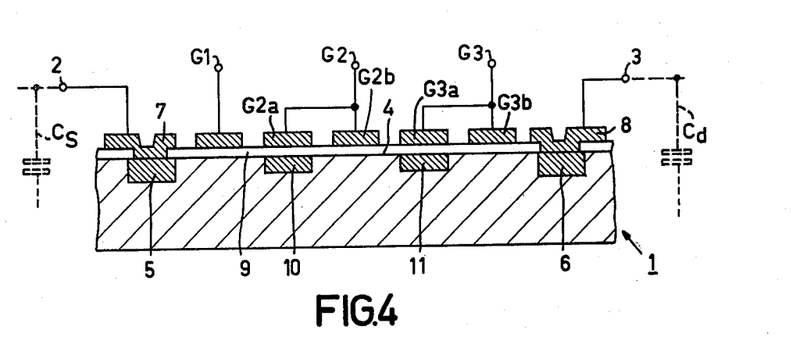
FIG. 4 is a cross-sectional view of a semiconductor device according to the invention.

FIG. 4 is a sectional view of a semiconductor device having a semiconductor body 1 comprising a switch with which, generally speaking, a charge signal from the capacitor $C_s$ can be transferred to the capacitor $C_d$ within, for example, the line suppression time in the case of a camera. The capacitors $C_s$ and $C_d$ which need not necessarily be integrated on the semiconductor body 1 are denoted only in broken lines in FIG. 4.

The switch comprises two terminals 2 and 3 which are or can be connected to $C_s$ and $C_d$, respectively, and which form a source electrode and drain electrode, respectively, of a field effect device with insulated control electrodes $G_1$, $G_2$, $G_3$. In a specific embodiment the device comprises a p-type semiconductor body of silicon but it will be obvious that there may also be started from an n-type semiconductor body and that the invention is not restricted either to the use of silicon but that other semiconductor materials may also be used advantageously.

The silicon body 1, which may have a resistivity of 0.3–5 ohm.cm which is usual for integrated MOST circuits, comprises at its surface 4 n-type surface zones 5 and 6 forming a source and drain region, respectively.

The terminals 2 and 3 are connected to the source region and drain region, respectively, via the source and drain electrodes 7 and 8, respectively, of, for example, Al which are contacted to the zones 5 and 6, respectively.

The surface 4 of the semiconductor body is covered with an insulating layer 9 which can be provided in a conventional manner as a layer of silicon oxide but which may also comprise other dielectric materials, such as silicon nitride or aluminium oxide. At least in the region bounded by the zones 5 and 6 the layer 9 has a thickness of approximately 700 Å–1000 Å. Beyond the active region shown in FIG. 4 the oxide layer 9, which then has the function of field oxide, may show a much larger thickness as is quite usual in semiconductor devices with field effect transistors.

A first gate electrode $G_1$ is provided on the insulating layer 9 between the source region 5 and the drain region 6, the function of which electrode can be compared with that of the gate electrode of a field effect transistor and with which the switch can be opened or closed at will.

According to the invention the switch comprises means ($G_{2a}$, $G_{2b}$, 10) by means of which during the transfer time T ($t_5-t_6$) a fixed quantity of charge $Q_t$ can periodically be transferred back to $C_s$ at such a frequency n that in a time interval $t<T$ an equilibrium situation is reached in which the charge transferred from $C_s$ per unit of time (second) is equal to the quantity of charge transferred back per unit of time. In this equilibrium situation the potential of the capacitance $C_s$ will no longer depend on the initial charge (signal) QS but mainly on n and $Q_t$.

The gat electrode $G_2$ shows two parts $G_{2a}$, $G_{2b}$ which are connected together. Below $G_{2a}$ means 10 are present as a result of which upon applying a voltage to $G_2$ in the semiconductor body an asymmetric potential profile is obtained with a potential pit below $G_{2a}$, in which the charge $Q_t$ to be transferred back can be stored, and with a potential barrier below $G_{2b}$.

The asymmetric potential profile below the electrode $G_2$ can be obtained in various ways which are known per se from the technology of charge coupled devices, for example, oxide layers below the electrodes $G_{2a}$ and $G_{2b}$ of different thicknesses. In the embodiment shown in FIG. 4 the asymmetry is formed by the difference in doping in the semiconductor body below the electrode parts $G_{2a}$ and $G_{2b}$ obtained by providing the n-type zone 10 below the electrode part $G_{2a}$. The doping concentration of the zone 10 can suitably be chosen by means of ion implantation so as to obtain a potential well of the desired depth and hence a charge $Q_t$ of the desired value, and is, for example, $10^{12}-10^{14}$ atoms/cm$^2$.

Although in a number of applications the transfer back means $G_{2a}$, $G_{2b}$, 10 will suffice, extra means are present in the present embodiment so as to fill the potential well below the electrode $G_{2a}$ when it is empty before charge is transferred from $C_s$ to $C_d$. These means, in this case present between $G_2$ and the drain ragion 6, comprises a third insulated gate electrode $G_3$. In structure the electrode $G_3$ corresponds to $G_2$ and, like $G_2$, comprises two parts $G_{3a}$ and $G_{3b}$ which are connected together. An n-type region 11 having the same doping concentration as the zone 10 is provided below the part $G_{3a}$. The lateral dimensions of $G_{3a}$ and the zone 11 are preferably chosen to be at least equal to or larger than those of $G_{2a}$, and zone 10. As a result of this, upon applying a suitable voltage below $G_{3a}$, a—filled—potential well can be formed which may be used as a reservoir for supplying the charge $Q_t$.

Figure 5:
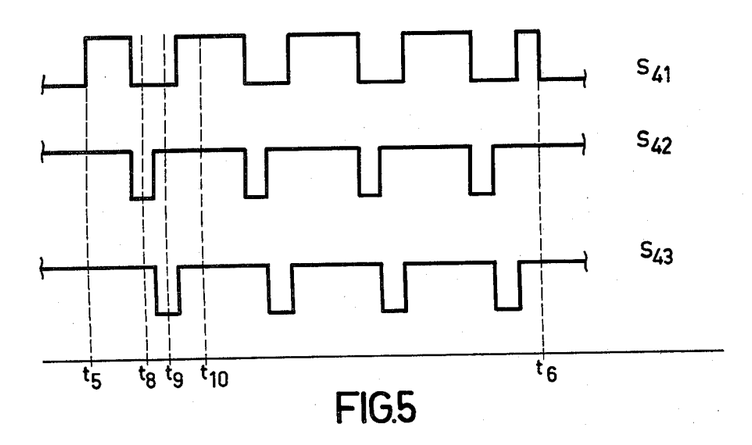
FIG. 5 illustrates voltage signals occurring during operation in a device shown in FIG. 1.

As shown in FIG. 1, the gate electrodes $G_1$, $G_2$ and $G_3$ are coupled to the clock voltage source 21 via the signal lines $S_{41}$, $S_{42}$ and $S_{43}$, respectively, FIG. 5 shows diagrammatically the signals $S_{41}$, $S_{42}$ and $S_{43}$ which replace the signal $S_4$ of FIG. 2.

In FIG. 5 the instants $t_5$ and $t_6$ are again shown which are situated within the line suppression time $T_b$ and which determine the time interval during which signal charge is transferred from the signal strips $4_1$, $4_2$, $4_3$ to the BBD 19'. The signal $S_4$ in FIG. 2 in the pick-up device in accordance with the invention is replaced by the signal $S_{41}$ in FIG. 5 which is applied to the gate electrodes $G_1$. It will be obvious from the variation of $S_{41}$ that the charge transport does not occur continuously but interruptedly, as will be explained hereinafter.

Figure 6:
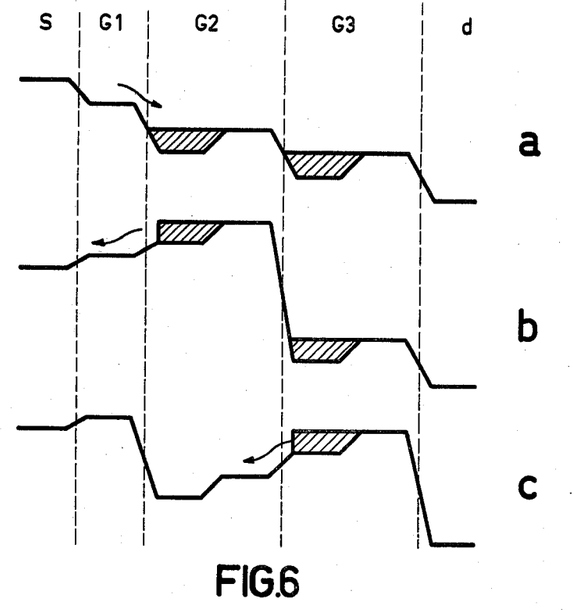
FIG. 6 shows potential profiles which occur during operation in the device shown in FIG. 4.

At the instant $t_5$ the signals $S_{42}$ and $S_{43}$ are also positive. The values of $S_{41}$, $S_{42}$ and $S_{43}$ can simply be chosen by those skilled in the art in such manner that in the semiconductor body the potential profile shown in FIG. 6a is obtained. In this figure, s and d, respectively, correspond to the source regions 5 and 6 in FIG. 4, while the regions indicated in FIG. 6 by $G_1$, $G_2$ and $G_3$ correspond to the parts of the semiconductor body underlying the gate electrodes $G_1$, $G_2$ and $G_3$, respectively. The regions in $G_2$ and $G_3$ which are shaded in FIG. 6 correspond to the n-type doped regions 10 and 11 in FIG. 4 and represent charge packets which are stored in the potential wells obtained by the doping. In the situation as shown in FIG. 6a charge (in the form of electrons) can flow from s to d as indicated diagrammatically by the arrow in FIG. 6a.

During this charge transport the potential level of S decreases so that the charge transport will occur in a more inert manner. In order to prevent this and associated problems, the charge transport is interrupted and the potential of $G_2$ is reduced until the charge packet stored below $G_2$ is transferred back to S. For illustration FIG. 6b shows the potential profile at the instant $t_8$.

In the next step the charge transport from s to d as shown in FIG. 6a could be continued. In this case the (empty) potential well below $G_2$ will be filled again with charge so that the potential in the potential well changes again. Because the gain factor $$\left(\frac{V_{ds}}{V_{gs}}\right) i = c$$

of the transistor formed by the zone 5 as source, $G_1$ as gate electrode and the potential well as drain zone is not infinitely large, this voltage variation has a reaction on S. With a specific gain factor of 10 and a capacitance ratio between s and the potential well below $G_2$ of approximately 100, 1/10 of the approximately 100×larger voltage variation below $G_2$ will react on the input of the transistor. In order to prevent this reaction and also the reaction from d to s at least for the greater part, the region $G_3$ is provided between $G_2$ and d. At $t_5$ such a positive voltage $S_{43}$ is applied to $G_3$ that below $G_3$ the potential profile shown in FIG. 6a is obtained in which the potential below $G_3$ lies slightly lower than below $G_2$ and at the area of the n-type doped zone 11 below $G_3$ a potential well is formed which is filled with charge. In FIG. 6a this charge packet is shown shaded.

After transferring the charge below $G_2$ in the manner shown in FIG. 6b, the charge transport from s to d is not resumed but first a positive voltage is applied to $G_2$ while the voltage $S_{43}$ at $G_3$ is reduced. FIG. 6c shows the potential profile in the switch at the instant $t_9$. The charge packet below $G_3$ can now flow in the potential well below $G_2$ and fill same. At $t_{10}$ the signals $S_{41}$, $S_{42}$ and $S_{43}$ are equal again to those at $t_5$, so that charge can flow again from s to d in the manner shown in FIG. 6a. During the charge transport the potential below $G_2$ will not vary at least substantially so that feedback coupling to s is avoided. Possible feedback coupling from $G_3$ to s may be neglected as a second order effect.

The transfer of the signal charge Q from the signal strips $4_1$, $4_2$, $4_3$ to the shift register 19' can be continued in the manner described and be interrupted periodically for transferring back charge.

In equilibrium the quantity of charge which is transferred back per unit of time is as large as the quantity which per unit of time flows from s to d. The frequency of the transfer back is chosen to be so that an equilibrium situation with Jo, Vo, (see FIG. 3) is obtained in which the impedance of the switch is sufficiently low to transfer any signal irrespective of its value within the line suppression time. This frequency can simply be chosen by those skilled in the art in accordance with the specific conditions in a concrete case. In a concrete embodiment in which $C_s$ was approximately 1 pF and the quantity of transferred-back charge was always 10 fC very satisfactory results could be obtained at a frequency of 1 MHz, that is to say when between $t_5$ and $t_6$ (FIG. 5) charge was transferred back to S approximately 10 times. Since the whole signal packet can be transferred from s to d within the period of $t_5-t_6$, pictures with intensity differences both in a vertical direction can be converted with great definition, while in a horizontal direction a considerable improvement of definition could be obtained in that the signal strips $4_1$, $4_2$, $4_3$ could each time be adjusted at a readily defined output voltage (Vo) so that parasitic cross-talk effects between the strips did substantially not occur.

Figure 7:
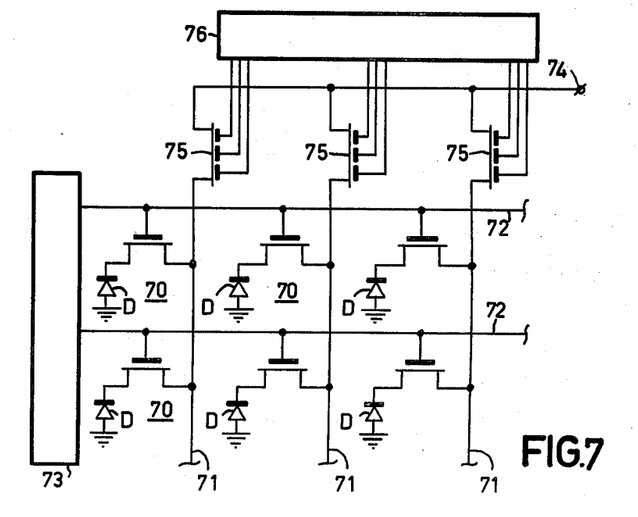
FIG. 7 shows diagrammatically a second picture pick-up device in accordance with the invention.

Besides in the camera tube described here, a switching according to the invention may also be used in cameras of a different type, for example, in cameras having a picture pick-up device as shown diagrammatically in FIG. 7. The device comprises a known matrix of photosensitive elements 70 which are arranged in rows and columns and which each comprise a diode D and a field effect transistor T. One main electrode region of the transistors T is connected to the diodes and the other main electrode region is connected to the read lines 71. The gate electrodes of the transistors are connected to the selection lines 72 which can be driven by a shift register 73. When one of the lines 72 is selected, the signal charges stored in the diodes D of the row in question can be transferred via the associated transistors T to the read lines 71. In behalf of the transfer of the signals from the lines 71 to a read line 74, switches 75 are provided between the lines 71 and the line 74, which switches correspond, as regards construction and function, to the switches $17'_1$, $17'_2$, $17'_3$ of the preceding embodiment. The switches 75 are connected to a clock voltage source 76 which applies voltages of the kind indicated in FIG. 5 to the gate electrodes of the switches.

As in the preceding embodiment, the switches 75 may be connected parallel to a CTD register, in which case the signals can be transferred simultaneously to the signal lines 71. In the embodiment shown, however, the switches 75 are connected in common to the output 74 and are therefore driven successively.

It will be obvious that the invention is not restricted to the embodiments described but that many variations are possible to those skilled in the art without departing from the scope of this invention. For example, instead of silicon, other suitable semiconductor materials, for example Ge or AIII-BV compounds, such as GaAs, may also be used. Instead of the implanted zones 10 and 11, other means known from CTD technology to obtain potential wells of the desired depth may also be used, such as different oxide thicknesses and/or series voltage sources between the electrodes $G_{2a}$ and $G_2$ and between the electrodes $G_{3a}$, $G_3$. Separate clock voltages may also be applied to the electrodes $G_{2a}$ and $G_2$, as well as to the electrode set $G_{3a}$, $G_3$.

In the embodiments described the switches comprise a surface channel. Instead of this, however, constructions with a buried channel in analogy to cod's with buried channel are possible.

What is claimed is:

1. A semiconductor device comprising a semiconductor body having a switching device for transferring a quantity of charge $Q_s$ from a first capacitor $C_s$ to a second capacitor Cd within a time interval T having a definite duration, characterized in that means are provided for periodically transferring during said time interval a fixed quantity of charge $Q_t$ back to $C_s$ at a frequency n/T, where n and $Q_t$ are chosen so that for a period of $t<T$, where t is measured from charge transport, charge transferred from $C_s$ per unit of time is approximately equal to charge transferred back into $C_s$ in the same unit of time, and the potential of $C_s$ is substantially independent of $Q_s$.

2. A semiconductor device as claimed in claim 1, characterized in that $Q_t$ is at most approximately 0.1 of the maximum value of $Q_s$.

3. A semiconductor device as claimed in claim 1, characterized in that a number of elements are present in which information in the form of electronic charge can be generated and/or stored and that furthermore selection means are present for selectively coupling said elements to the electrode of $C_s$, connected to said switching device, for transferring information stored in said elements to $C_s$.

4. A semiconductor device as claimed in claim 1, characterized in that said switching device is of a field effect type and comprises two surface regions which adjoin a surface of said semiconductor body and which form a source and drain region of the field effect device said source and drain region being coupled to said first and second capacitor, respectively, and said source and drain region being separated from each other by a channel region, said channel region when viewed in the direction of current passage from source region to drain region comprising at least two gate electrodes situated one behind the other with said first gate electrode being destined to control current passage through said channel region and said second gate electrode being destined to induce in the underlying part of the channel region a potential well to store the charge $Q_t$ which can be transferred back to the source region by applying a suitable voltage to said second gate electrode.

5. A semiconductor device as claimed in claim 4, characterized in that means are present for obtaining upon applying a voltage to the second gate electrode an asymmetric potential profile with a potential well near the edge of said second gate electrode situated on the side of the source region in the part of the semiconductor body below said second gate electrode.

6. A semiconductor device as claimed in claim 5, characterized in that said means for obtaining an asymmetric potential profile comprise a region situated at the area of said potential well and having a doping concentration differing from that of adjoining surface parts of said semiconductor body.

7. A semiconductor device as claimed in claim 6, characterized in that said region at the area of said potential well below said second gate electrode is formed by a zone implanted with impurities.

8. A semiconductor device as claimed in claim 4, characterized in that means are provided for filling said potential well below said second gate electrode, after transferring back the charge $Q_t$ to the source region, with charge before fresh charge is transferred from said source region to said drain region.

9. A semiconductor device as claimed in claim 8, characterized in that said means for filling the potential well below said second gate electrode comprise a third gate electrode between said second gate electrode and said drain region for inducing a second potential well in the underlying part of said semiconductor body in which well charge can be stored at least at the value of $Q_t$.

10. A semiconductor device as claimed in claim 9, characterized in that means are provided upon applying a voltage to the third gate electrode in the underlying part of the semiconductor body for forming an asymmetric potential profile with a potential well below and near the edge of said third gate electrode situated on the side of said source region.

11. A semiconductor device as claimed in claim 10, characterized in that said means for forming an asymmetric potential profile comprise a surface region situated at the area of the potential well to be formed and having a doping concentration differing from that of adjoining parts of said semiconductor body.

12. A picture pick-up camera comprising a semiconductor device as claimed in claim 11.

13. A semiconductor device as claimed in claim 3, characterized in that said electrode of $C_s$ comprises a strip-shaped conductor forming, together with the associated information-containing elements, part of a picture pick-up device comprising a number of similar strip-shaped conductors and associated information elements, said information elements being formed by a mosaic of photosensitive cells arranged in lines and columns.

14. A semiconductor device as claimed in claim 13, characterized in that said strip-shaped conductors extend parallel to the column direction of the mosaic and are each individually connected to an associated switching device.

15. A semiconductor device as claimed in claim 14, characterized in that said switching devices, which are connected on one side to the strip-shaped conductors, are connected on the other side to parallel inputs of a charge transfer register wherein signal charges $Q_s$ can be transferred parallel per line via the switching devices in said charge transfer register, and wherein said signal charges $Q_s$ can be transported to an output so as to be derived elsewhere in series.

16. A semiconductor device as claimed in claim 13, characterized in that said parameter n and $Q_t$ are chosen so that t is smaller than or equal to the line flyback time.

17. A picture pick-up camera comprising a semiconductor device as claimed in claim 13.

* * * * *